(12) United States Patent  
Martinez

(10) Patent No.: US 9,246,721 B1
(45) Date of Patent: Jan. 26, 2016

(54) SPORADIC CHANNEL FILTERING

(71) Applicant: Vincent Pierre Martinez, Castres (FR)

(72) Inventor: Vincent Pierre Martinez, Castres (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/714,857

(22) Filed: May 18, 2015

(30) Foreign Application Priority Data

Dec. 16, 2014 (WO) .................. PCT/IB2014/003050

(51) Int. Cl.
*H04L 25/49* (2006.01)
*H04L 25/08* (2006.01)
*H04L 27/26* (2006.01)
*H04J 11/00* (2006.01)

(52) U.S. Cl.
CPC ............. *H04L 25/08* (2013.01); *H04J 11/0023* (2013.01); *H04L 27/2607* (2013.01); *H04L 27/2627* (2013.01)

(58) Field of Classification Search
CPC ................ H03F 1/3247; H04L 27/368; H04L 27/03343; H04W 52/0206; H04W 72/0473
USPC .............................. 375/296, 298, 350; 331/17
See application file for complete search history.

(56) References Cited

U.S. PATENT DOCUMENTS

| | | | |
|---|---|---|---|
| 2001/0037158 A1* | 11/2001 | Trapasso ............... | G05B 5/01 700/28 |
| 2010/0098190 A1 | 4/2010 | Kim | |
| 2015/0257097 A1* | 9/2015 | Proctor, Jr. ........... | H04B 7/2618 370/311 |

* cited by examiner

*Primary Examiner* — Khai Tran

(57) ABSTRACT

A digital up-converter (DUC) circuit for performing digital channel filtering of an incoming baseband digital signal. The proposed circuit reduces the complexity of the channel module filter of the DUC. This is achieved by taking advantage of the structure of the underlying symbol waveforms carried by the incoming baseband digital signal which have one or more known discontinuities comprising random amplitude and/or phase. Namely, the channel filter module is activated only for the digital samples located around the known discontinuities and is deactivated for the remaining digital samples. Further, the switching of the channel filter module from one state to another can be performed according to a smooth function so that further discontinuities are not introduced in the incoming baseband digital signal. A method and a computer program are also disclosed.

15 Claims, 4 Drawing Sheets

SPORADIC CHANNEL FILTERING

CROSS REFERENCE TO RELATED APPLICATION(S)

The present application claims priority to International Patent Application No. PCT/IB2014/003050, entitled "SPORADIC CHANNEL FILTERING," filed on Dec. 16, 2015, the entirety of which is herein incorporated by reference.

FIELD OF THE INVENTION

This invention relates to a digital up-converter (DUC) circuit, a method and a computer program for performing digital channel filtering of an incoming baseband digital signal.

BACKGROUND OF THE INVENTION

Demands for higher data rates for mobile services are steadily increasing. At the same time modern mobile communication systems such as 3rd Generation systems (3G) and 4th Generation systems (4G) provide enhanced technologies, which enable higher spectral efficiencies and allow for higher data rates and cell capacities. Conventional base station transmitter in wireless communication systems like the Universal Mobile Telecommunication System (UMTS) and Long Term Evolution (LTE) system can be split into two separate units, a Remote Unit (RU), which is also referred to as Remote Radio Head (RRH), and a Central Unit (CU), connected either by electrical or optical links through a backhaul network.

One of the interface protocols which enable such a distributed architecture is called Common Public Radio Interface (CPRI). With such architecture, RUs offload Intermediate Frequency (IF) and Radio Frequency (RF) processing from the base station transmitter. Furthermore, the base station transmitter and RF antennas can be physically separated by a considerable distance, thus providing greater deployment flexibility of the system.

The RU comprises a Radio Frequency (RF) front-end, i.e. analog transmit RF components. Typical advanced processing algorithms on RUs include Digital Up-Conversion (DUC), Crest Factor Reduction (CFR) and Digital Pre-Distortion (DPD). DUC interpolates baseband digital signals to a much higher sample rate via a cascade of interpolation filters and further mixes the complex data channels with Intermediate Frequency (IF) carrier signals so that RF modulation can be simplified. Filtering may be needed for baseband digital signal occupying a single component carrier, as is the case in a LTE downlink, in order to get rid of unwanted out-of-band emissions, and comply with regulatory spectrum emission masks (SEM).

One of the reasons for frequency leakage to adjacent channels is that discontinuities often occur between the waveforms of symbols comprised in the baseband digital signal, where the symbols are contiguously arranged. For instance, in the generation of an Orthogonal Frequency Division Multiplexing (OFDM) baseband digital signal, there is generated a discontinuity between an OFDM symbol and the cyclic prefix of the next adjacent OFDM. This signal discontinuity can cause undesired spectral leakage into nearby frequency bands that may need to be suppressed by filtering. Such discontinuity may be suppressed by digital filtering techniques which are usually agnostic to the type of symbols being conveyed by the baseband digital signal.

However, the complexity of the filtering processing may be reduced by considering the type of symbols conveyed by the baseband digital signal during digital filtering.

SUMMARY OF THE INVENTION

The present invention provides a digital up-converter (DUC) circuit, a method and a computer program for performing digital channel filtering of an incoming baseband digital signal, as described in the accompanying claims Specific embodiments of the invention are set forth in the dependent claims.

These and other aspects of the invention will be apparent from an elucidated with reference to the embodiments described hereinafter.

BRIEF DESCRIPTION OF THE DRAWINGS

Further details, aspects and embodiments of the proposed solution will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the proposed solution may for the most part, be composed of electronic components and circuits known to those skilled in the art, details will not be explained in any greater extent than that considered necessary for the understanding and appreciation of the underlying concepts of the subject application, in order not to obfuscate or distract from the teachings of the subject application.

For the sake of understanding of the subject application, the following detailed description will focus on an Orthogonal Frequency Division Multiplexing (OFDM) transmitters such as those commonly used in Long Term Evolution (LTE) system at the eNodeB level. However, persons skilled in the art of communication systems will readily appreciate that the proposed solution may also apply to other communication systems different from LTE system, where those others communication systems exhibit the same characteristics as those described thereinafter.

Figure 1:
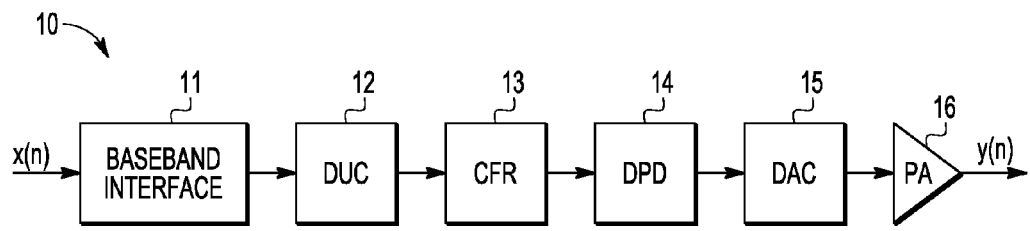
FIG. 1 is a schematic diagram of a transmitter.

First, for the sake of clarity, the generation of a transmission signal according to a transmitter, such as the transmitter 10 as illustrated in FIG. 1, will be described. In the example of FIG. 1, the transmitter 10 is implemented in a wireless communication device such as an eNodeB (not shown). The transmitter 10 comprises a baseband interface 11 which receives an incoming baseband digital signal x(n) which corresponds to a digital representation of one or more Radio Frequency (RF) signals to be wirelessly propagated to one or more wireless devices such as User Equipments (not shown in FIG.

1). Such a digital representation of an RF signal comprises digital samples of the RF signal at the baseband level. The digital samples may be IQ samples which comprise an in-phase digital baseband component and a quadrature digital baseband component. The baseband digital signal x(n) may have been generated based on Internet Protocol (IP) data of the wireless communication device. The baseband interface 11 is operably coupled to a Digital Up-Conversion (DUC) circuit 12 which converts the incoming baseband digital signal x(n) to an appropriate digital format with suitable data rate. Namely, interpolation is performed by an interpolator module (not shown in FIG. 1) on the incoming baseband digital signal x(n) after being filtered through a channel filter module (not shown in FIG. 1). The channel filter module may comprise a cascade of filters arranged to filter the baseband digital x(n). The interpolated baseband digital signal is then up-converted to an appropriate Intermediate Frequency (IF) signal such as quadrature phase shift keying (QPSK) differential quadrature phase shift keying (DQPSK), frequency modulation (FM) or amplitude modulation (AM) signals, thereby generating an IF baseband digital signal, so that RF modulation can be simplified. The DUC circuit 12 is operably coupled to a Crest Factor Reduction (CFR) circuit 13 which reduces the peak-to-average power ratio (PAPR) of the IF baseband digital signal, so it allows to go further in the non-linear region of the RF power amplifier 16. The CFR circuit 13 is operably coupled to a Digital Pre-Distortion (DPD) circuit 14 which estimates the distortion caused by the non-linear effect of the RF power amplifier 16 and pre-compensates the output of the CFR circuit 13. The DPD circuit 14 is operably coupled to a digital-to-analog converter (DAC) circuit 15 which converts the output of the DPD circuit 14 to IF analog signals. The DAC circuit 15 is operably coupled to the RF power amplifier 16 which converts the IF analog signals to a RF signal to be wirelessly propagated to one or more wireless devices.

Figure 2A:
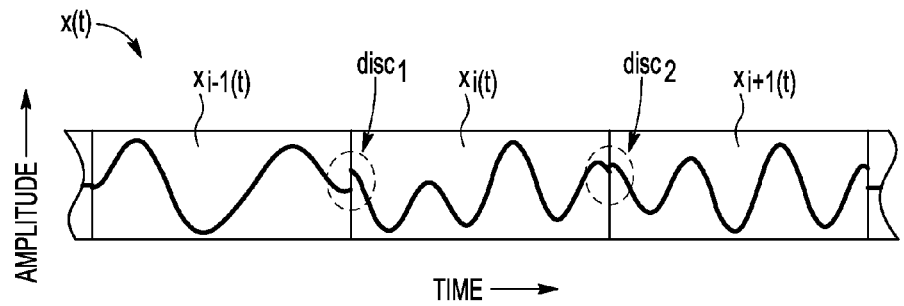
FIGS. 2A-2B are exemplary waveform representation of symbols comprised in a baseband digital signal.
Figure 2B:
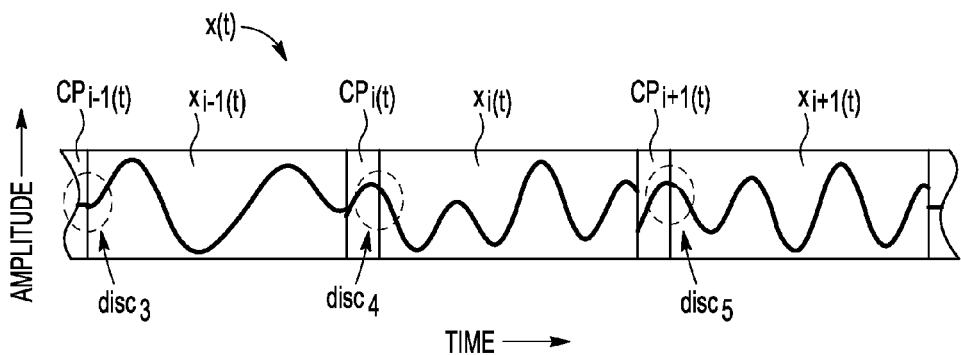

Secondly, focus will be put on the DUC circuit 12, and more particularly to the channel filter module. As stated earlier, the channel filter module may be needed for baseband digital signal occupying a single component carrier as it is the case in a LTE downlink, in order to get rid of unwanted out-of-band emissions. This is because a discontinuity often occurs between the waveform representation of the symbols comprised in the baseband digital signal x(n), where the symbols are contiguously arranged as illustrated in FIG. 2A. The symbols comprised in the baseband digital signal x(n) may be of any kind depending on the underlying communication system such as LTE or UMTS. In the example of FIG. 2A, there is diagrammatically shown therein a waveform representation of the baseband digital signal x(n), the waveform representation comprising a sequence x(t) of symbol waveforms $x_{i-1}(t)$, $x_i(t)$, $x_{i+1}(t)$ which are contiguously arranged. By the word contiguous, it should understood the symbol waveforms are so located as to touch, meaning that consecutive waveforms symbols are in actual contact. In other words, this means that no gaps are allowed between two consecutive symbol waveforms. The amplitude of a waveform and its derivatives, as is well known in the art, are generally complex quantities that can be represented with in-phase and quadrature components. As can be seen in FIG. 2A, it can be noticed the presence of discontinuities at borders between symbol waveforms taken two-by-two. These discontinuities usually comprise random in amplitude and/or phase of the sequence x(t). This can be seen, for instance at the border between the symbol waveforms $x_{i-1}(t)$ and $x_i(t)$ where a discontinuity $disc_1$ is located and also at the border between the symbol waveforms $x_i(t)$ and $x_{i+1}(t)$ where another discontinuity $disc_2$ is located. It should be apparent that the discontinuities $disc_1$, $disc_2$ are mainly responsible for generating high-frequency components which cause unwanted out-of-band power leakage, thereby creating interference(s) in adjacent channel(s), as previously discussed. However, such discontinuities are also experienced where the symbol waveforms are separated or bounded by guard period waveforms, as it is usually the case in OFDM communication systems, as illustrated in FIG. 2B. The sequence x(t) of FIG. 2B, is the similar to the sequence x(t) of FIG. 2A wherein each symbol waveform comprises a leading cyclic prefix (CP) $CP_{i-1}(t)$, $CP_i(t)$, $CP_{i+1}(t)$, respectively. Thus, in the case where the symbol waveforms represent OFDM symbol waveforms, it can be noticed the presence of discontinuities in amplitude and/or phase of the sequence x(t), at borders between the CP and respective OFDM symbol waveforms taken two-by-two. This can be seen, for instance at the border between the cyclic prefix $CP_{i-1}(t)$ and the symbol waveforms $x_{i-1}(t)$ where a discontinuity $disc_3$ is located, at the border between the cyclic prefix $CP_i(t)$ and the symbol waveforms $x_i(t)$ where another discontinuity $disc_4$ is located and also at the border between the cyclic prefix $CP_{i+1}(t)$ and the symbol waveforms $x_{i+1}(t)$ where yet another discontinuity $disc_5$ is located. It should be apparent that the discontinuities $disc_3$, $disc_4$, $disc_5$ are also responsible for generating high-frequency components which cause unwanted out-of-band power leakage, thereby creating interference(s) in adjacent channel(s), as previously discussed.

It should be apparent that filtering may be used to suppress signal discontinuities which can causes undesired spectral leakage into nearby frequency bands. However, conventional channel filter modules are usually agnostic to the type of symbols being conveyed by the baseband digital signal. This means that conventional channel filter modules do not take into account the underlying type of communication system data conveyed by the baseband digital signal. Hence, for conventional channel filter modules, it does not matter whether the baseband digital signals piggy back LTE data or UMTS data. This is mainly due to the fact that conventional channel filter modules are designed for the worst case scenarios and are optimized for working with a stream of baseband digital signals without having to bother about the type of signal being filtered. In contrast, in the subject application, it is proposed to consider the type of symbols conveyed by the baseband digital signal during digital filtering, where the baseband digital signal comprises known discontinuities comprising random amplitude and/or phase. In fact, it is proposed to perform channel filtering only on a given number of digital samples located around the known discontinuities. The foregoing given number of digital samples can be adapted to suit the needs of implementation. However, it is to be noted that the foregoing given number of digital samples is substantially lower than the number of digital samples associated with one symbol. This way, the complexity of the channel filter module is reduced. Indeed, with the subject application, channel filtering processing may be reduced by an order of magnitude up to −80% or −90%, for the same adjacent channel leakage rejection performance. Further, the carrier error vector magnitude (EVM), which measures the in-band quality of the signal, can also be slightly improved, due to filtering less time domain samples.

Figure 3:
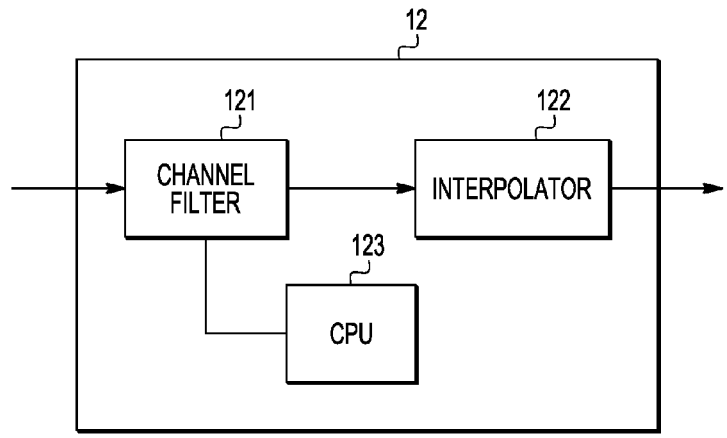
FIG. 3 is an exemplary digital up-conversion (DUC) circuit according to embodiments of the subject application.

Referring now to FIG. 3, there is diagrammatically shown therein an exemplary DUC circuit 12 in accordance with embodiments of the subject application. In FIG. 3, the DUC circuit 12 comprises:

a channel filter module 121 similar to those normally encountered in wireless communication systems, arranged to filter digital samples of baseband digital signal(s);

an interpolator module 122 similar to those normally encountered in wireless communication systems, arranged to interpolate filtered digital samples of baseband digital signals; and, a processing unit such as a processor 123.

In FIG. 3, the channel filter module 121 is operably coupled to the interpolator module 122 and to the processing unit 123.

In embodiments, the channel filter module 121 has an active mode of operation and a standby mode of operation. Namely, in the active mode, the channel filter module 121 is arranged to perform digital channel filtering, while in the standby mode, the channel filter module 121 is arranged not to perform digital channel filtering.

In embodiments, the processing unit 123 is arranged to set the channel filter module 121 in the active mode, for a given number N of digital samples around the first discontinuity. Further, the processing unit 123 is arranged to set the channel filter module 121 in the active mode, for the remaining digital samples.

Figure 4A:
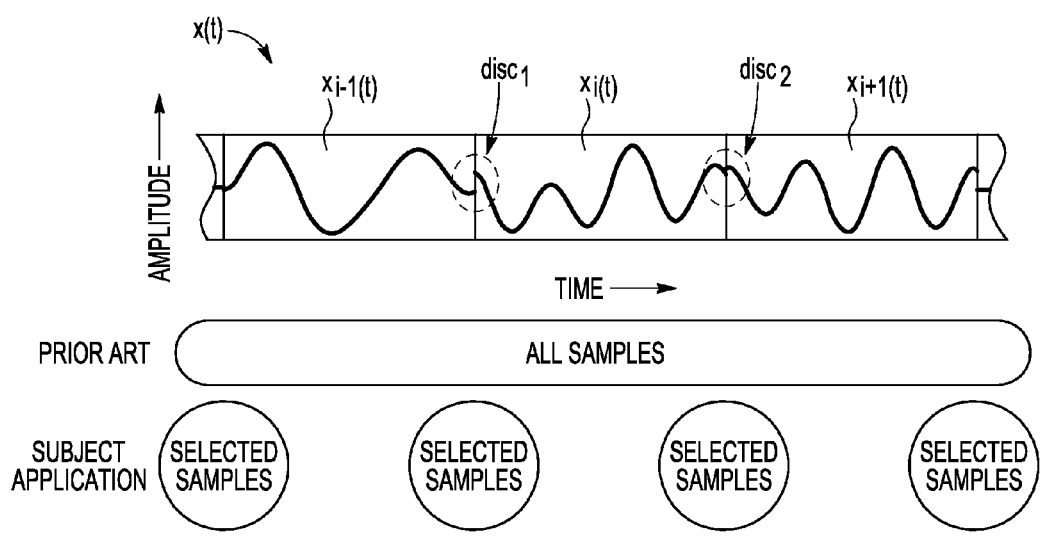
FIGS. 4A-4B are exemplary waveforms of FIGS. 2A-2B along with indication of the amount of digital samples that are filtered in the prior art versus the subject application.

Referring to FIG. 4A, there is diagrammatically show therein the same content as in FIG. 2A along with an indication of the amount of digital samples that are filtered in the prior art versus the subject application. As can be seen from FIG. 4A, in the subject application where symbol waveforms are contiguous, it is only filtered by the channel filter module 121, the digital samples located around the border of symbol waveforms taken two-by-two. In contrast, in the prior art, all digital samples are filtered by the channel filter module 121. It should be apparent from this, that if the same channel filter module 121 is used in the prior art and the subject application, no difference should be visible in terms of the quality of the filtering results. However, with the subject application the complexity of the channel filter module 121 can be drastically reduced. In fact, the channel filter module 121 of the subject application does not have to be designed for the worst case scenario, but can be design to support reduced number digital samples, since fewer digital samples need be considered. Further, it has been observed that the carrier error vector magnitude (EVM), which measures the in-band quality of the signal, can also be slightly improved, due to filtering less time domain samples.

Figure 4B:
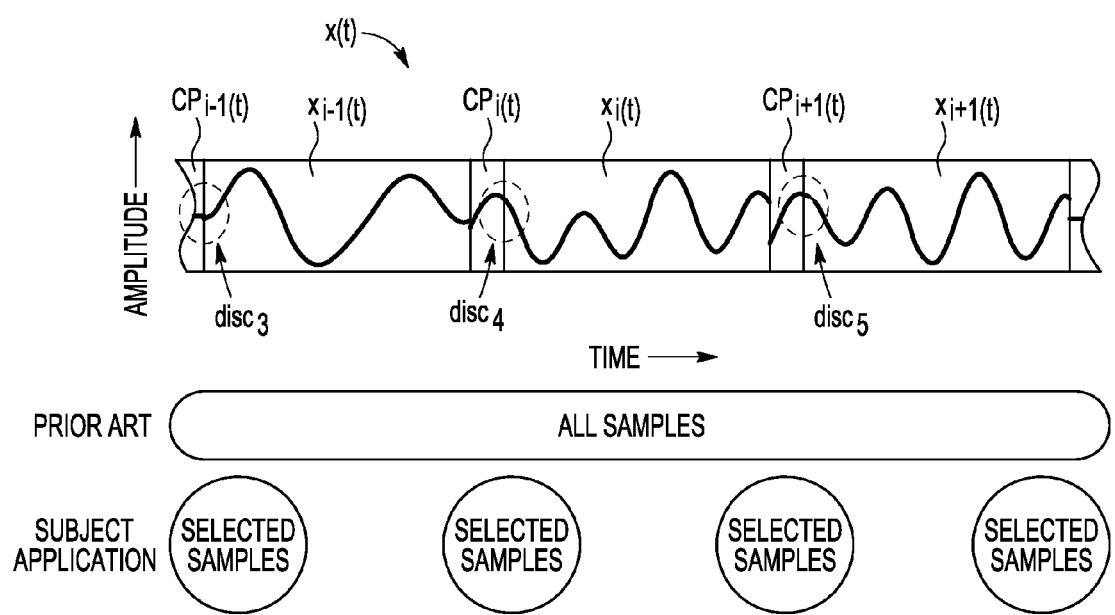

Referring to FIG. 4B, there is diagrammatically show therein the same content as in FIG. 2B along with an indication of the amount of digital samples that are filtered in the prior art versus the subject application. As can be seen from FIG. 4B, in the subject application where symbol waveforms are contiguous, each having a leading CP, it is only filtered by the channel filter module 121, the digital samples located around the CP. In a first embodiment, it is considered at the same time, the discontinuities between symbol waveforms taken two-by-two and the discontinuities between the CP and respective symbol waveform taken two-by-two. However, in a second embodiment, it may be filtered only the digital samples located around each discontinuity.

Figure 5:
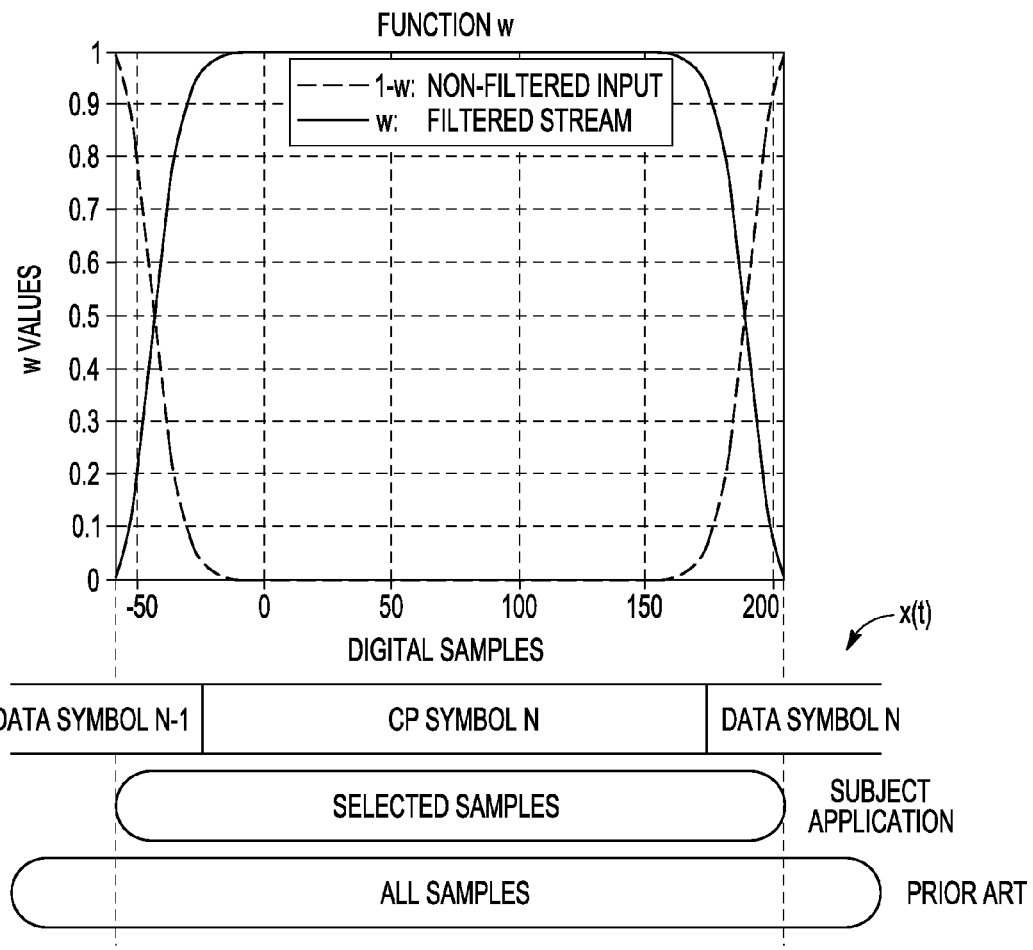
FIG. 5 is an exemplary block representation of FIGS. 4A-4B along with a smooth weight function used to switch between the different states of the channel filter module of the subject application.
Figure 6:
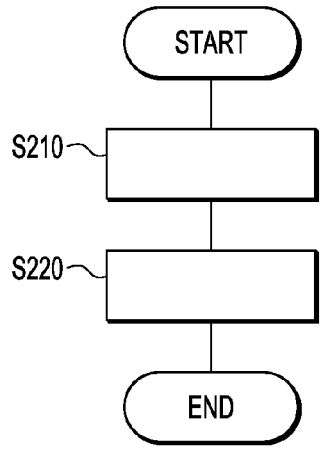
FIG. 6 is a schematic flow diagram of a method of performing digital channel filtering of an incoming baseband digital signal according to an embodiment of the subject application.

In another embodiment, the processing unit 123 is further arranged to switch the channel filter module 121 between the active mode and the standby mode according to a smooth weight function. For instance, the smooth weight function is a raised cosine waveform. This way, the transition between the two operation modes of the channel module 121 is performed smoothly in order not to introduce further discontinuities in the baseband digital signal. Referring to FIG. 5, there is diagrammatically shown therein a graphical representation of smooth weight function w in accordance with the subject application. In FIG. 5, below the graph showing the smooth weight function w, there is shown another representation of the sequence x(t) of FIG. 4B along with an indication of the amount of digital samples that are filtered in the prior art versus the subject application. As can be seen from FIG. 5, in the subject application where symbol waveforms are contiguous, each having a leading CP, the switching from the active mode to the standby mode, or the converse, is performed smoothly, on the selected data samples. Of course, the foregoing also applies to the sequence x(t) of FIG. 4A.

In embodiments, the processing unit 123 is further arranged to switch the channel filter module 121 between the active mode and the standby mode during a cycle of the smooth weight function. As already explained above with regards to FIGS. 2A-B, the switching of the channel filter module 121 between the active mode and the standby mode can be arranged so as to filter one or more discontinuities.

In embodiments, the channel filter module comprises one or more finite impulse response (FIR) low-pass filter. For instance, it could be used a non-causal FIR filter where the regions in which the channel filter module 12 is in active mode/standby mode on/off, is defined according to the following equation:

$$y(n) = \sum_{k=-\frac{K-1}{2}}^{\frac{K-1}{2}} h(k) \times x(n+k) \quad (1)$$

where y is the filtered baseband digital signal, h is the impulse response holding the FIR coefficients and x is the baseband digital signal to be filtered. Further, K is the number of filter taps, k is the filter tap index which is used in the weighted sum of neighbor x samples. The k index is ranging from index $$-\frac{K-1}{2} \text{ to } +\frac{K-1}{2}$$

where K is an odd number. Still further, n represents the input digital sample (e.g. IQ sample), or a vector of input digital samples.

The equation (1) means that when digital samples are selected to be filtered, it is only considered the K/2 digital samples neighbors on the left, the K/2 digital samples neighbors on the right, if K is an odd number. In contrast, the more classical causal FIR filter is characterized by the following equation: $y(n) = \sum_{k=0}^{K-1} h(k) \times x(n-k)$ (2). However mathematically identical to equation (1), the latter form is not preferred because it introduces a delay of the size of $$\pm \frac{K-1}{2}.$$

Referring to FIG. 4, there is diagrammatically shown therein a schematic flow diagram of a method of performing digital channel filtering of an incoming baseband digital signal according to an embodiment of the subject application.

In S210, there is provided a channel filter module arranged to perform digital channel filtering on the digital samples, the channel filter module having an active mode and a standby mode of operation, wherein:

in the active mode, digital channel filtering is performed; and, in the standby mode, digital channel filtering is not performed.

In S220, there is provided a processing unit, such as a processor, operably coupled to the channel filter module and arranged to set the channel filter module:

in the active mode, for a given number N of digital samples around the first discontinuity; and, in the standby mode, for the remaining digital samples; wherein the given number N of digital samples is substantially lower than the number of digital samples associated with one symbol.

It has now become clear that the proposed solution reduces the complexity of the channel module filter. Indeed, the proposed solution removes the need of filtering all digital samples of a given incoming baseband digital signal. This is achieved by taking advantage of the structure of the underlying symbol waveforms carried by the incoming baseband digital signal which have one or more known discontinuities comprising random amplitude and/or phase. Namely, the channel filter module is activated only for the digital samples located around the known discontinuities and is deactivated (or in standby) for the remaining digital samples. This means that a sporadic channel filtering is performed with the proposed solution in contrast with the continual channel filtering performed in the prior art. The number of digital samples to be considered may be adapted with regards to adaptation needs. Further, the switching of the channel filter module from one state to another can be performed according to a smooth function so that further discontinuities are not introduced in the incoming baseband digital signal.

Further, persons skilled in the art of communication systems will readily appreciate that the proposed solution may also apply to other communication systems different from LTE system, where those others communication systems exhibit the same characteristics as those described thereinafter.

The above description elaborates embodiments of the subject application with regard to baseband digital signals in LTE communication systems. However, the teachings of the subject application may be readily contemplated for other communication systems such as UMTS, as long as known discontinuities are present in the baseband digital signals that need be filtered by a channel filter module.

Of course, the above advantages are exemplary, and these or other advantages may be achieved by the proposed solution. Further, It should be apparent that not all advantages stated above are necessarily achieved by embodiments described herein.

The proposed solution may also be implemented in a computer program product stored in a non-transitory computer-readable storage medium that stores computer-executable code which causes a processor computer to perform the operation of the channel filter module 121 and the processing unit 123 and/or the exemplary method as illustrated in the foregoing description, for instance.

A computer program product is a list of instructions such as a particular application program and/or an operating system. The computer program may for example include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory unit storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, multipoint-to-point telecommunication equipment and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as an operation to users and programs of the system.

The computer system may for example include at least one processing unit, associated memory unit and a number of input/output (I/O) devices. When executing the computer program, the computer system processes information according to the computer program and produces resultant output information via I/O devices.

In the foregoing specification, the proposed solution has been described with reference to specific examples of embodiments of the proposed solution. It will, however, be evident that various modifications and changes may be made therein without departing from the broader scope of the proposed solution as set forth in the appended claims. For instance, in the description, the baseband interface has been considered as a Common Public Radio Interface (CPRI) which is not limited by the embodiment of the present invention, but it may also be an Open Base Station Architecture Initiative (OBSAI) or other types of baseband interface such as Ethernet based protocols.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of devices to achieve the same functionality is effectively "associated" such that the desired functionality is achieved. Hence, any two devices herein combined to achieve a particular functionality may be seen as "associated with" each other such that the desired functionality is achieved, irrespective of architectures or intermediate devices. Likewise, any two devices so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple examples of a particular operation, and the order of operations may be altered in various other embodiments. For instance, the functionalities of the channel filter module 121 and the processing unit 123 may be comprised in a single unit.

Also for example, the examples, or portions thereof, may implemented as soft or code representations of physical circuitry or of logical representations convertible into physical circuitry, such as in a hardware description language of any appropriate type.

Also, the proposed solution is not limited to physical devices or units implemented in nonprogrammable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or operations then those listed in a claim. Furthermore, the terms "a" or "an," as used herein, are defined as one or as more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital up-converter, DUC, circuit for performing digital channel filtering of an incoming baseband digital signal and up-converting the filtered incoming baseband digital signal into an intermediate Frequency, IF, baseband digital signal, the incoming baseband digital signal comprising digital samples representative of a plurality of contiguous symbols having at least a first discontinuity comprising random amplitude and/or phase, between symbols taken two-by-two, the DUC comprising:
a channel filter module arranged to perform digital channel filtering on the digital samples, the channel filter module having an active mode and a standby mode of operation, wherein:
in the active mode, digital channel filtering is performed; and,
in the standby mode, digital channel filtering is not performed;
a processing unit, such as a processor, operably coupled to the channel filter module and arranged to set the channel filter module:
in the active mode, for a given number N of digital samples around the first discontinuity; and,
in the standby mode, for the remaining digital samples;
wherein the given number N of digital samples is substantially lower than the number of digital samples associated with one symbol.

2. The DUC circuit of claim 1, wherein:
the symbols are OFDM symbols, each having respective cyclic prefix, CP, thereby creating a second discontinuity comprising random amplitude and/or phase, between the CP and respective OFDM symbol taken two-by-two; and,
the processing unit is further arranged to set the channel filter module in the active mode, for a given number M of digital samples around the second discontinuity;
wherein the given number M of digital samples is substantially lower than the number of digital samples associated with one OFDM symbol.

3. The DUC circuit of claim 1, wherein the processing unit is further arranged to switch the channel filter module between the active mode and the standby mode according to a smooth weight function.

4. The DUC circuit of claim 3, wherein the smooth weight function is a raised cosine waveform.

5. The DUC circuit of claim 3, wherein the processing unit switches for the first and/or second discontinuity during a cycle of the smooth weight function.

6. The DUC circuit of claim 1, wherein the channel filter module comprises a FIR low-pass filter.

7. A transmitter unit for a wireless communication system, the transmitter unit comprising:
the digital up-converter, DUC, circuit of claim 1; and,
a digital baseband interface operably coupled to the DUC and arranged to provide the incoming baseband digital signal.

8. The transmitter of claim 7, wherein the digital baseband interface comprises one the Open Base Station Architecture Initiative, OBSAI, or the common public radio interface, CPRI.

9. A method of performing digital channel filtering of an incoming baseband digital signal in digital up-converter, DUC, circuit and up-converting the filtered incoming baseband digital signal into an intermediate Frequency, IF, baseband digital signal, the incoming baseband digital signal comprising digital samples representative of a plurality of contiguous symbols having at least a first discontinuity comprising random amplitude and/or phase, between symbols taken two-by-two, the method comprising:
providing a channel filter module arranged to perform digital channel filtering on the digital samples, the channel filter module having an active mode and a standby mode of operation, wherein:
in the active mode, digital channel filtering is performed; and,
in the standby mode, digital channel filtering is not performed;
providing a processing unit, such as a processor, operably coupled to the channel filter module and arranged to set the channel filter module:
in the active mode, for a given number N of digital samples around the first discontinuity; and,
in the standby mode, for the remaining digital samples;
wherein the given number N of digital samples is substantially lower than the number of digital samples associated with one symbol.

10. The method of claim 9, wherein:
the symbols are OFDM symbols, each having respective cyclic prefix, CP, thereby creating a second discontinuity comprising random amplitude and/or phase, between the CP and respective OFDM symbol taken two-by-two; and, the method further comprising:

setting the channel filter module in the active mode, for a given number M of digital samples around the second discontinuity, wherein the given number M of digital samples is substantially lower than the number of digital samples associated with one OFDM symbol.

11. The method of claim 9, further comprising switching the channel filter module between the active mode and the standby mode according to a smooth weight function.

12. The method of claim 11, wherein the smooth weight function is a raised cosine waveform.

13. The method of claim 11, wherein the switching for the first and/or second discontinuity is performed during a cycle of the smooth weight function.

14. The method of claim 9, wherein the channel filter module comprises a FIR low-pass filter.

15. A computer program product stored in a non-transitory computer-readable storage medium that stores computer-executable code for performing digital channel filtering of an incoming baseband digital signal and up-converting the filtered incoming baseband digital signal into an intermediate Frequency, IF, baseband digital signal, the incoming baseband digital signal comprising digital samples representative of a plurality of contiguous symbols having at least a first discontinuity comprising random amplitude and/or phase, between symbols taken two-by-two, the computer-executable process causing a processor computer to perform the method according to claim 9.

* * * * *